United States Patent [19]

Atkins

[11] 3,828,273

[45] Aug. 6, 1974

[54] CONDITION-RESPONSIVE CONTROL CIRCUIT INCLUDING PULSE-ENERGIZED OSCILLATOR AND AMPLIFIER

[75] Inventor: Carl E. Atkins, Montclair, N.J.

[73] Assignee: Wagner Electric Corporation, Parsippany, N.J.

[22] Filed: July 23, 1973

[21] Appl. No.: 381,573

[52] U.S. Cl. .................. 331/65, 331/75, 331/117 R, 331/166, 340/258 C

[51] Int. Cl. .......................... G08b 13/26, H03b 5/12

[58] Field of Search ............ 331/65, 75, 117 R, 166; 317/146, 148.5 R; 340/258 C, 278, 279, 280

[56] References Cited

UNITED STATES PATENTS 3,254,313 5/1966 Atkins et al. .................... 331/65 X
3,483,437 12/1969 Coyne .............................. 331/65 X
3,569,728 3/1971 Atkins .................................. 331/65

*Primary Examiner*—Herman Karl Saalbach
*Assistant Examiner*—Siegfried H. Grimm
*Attorney, Agent, or Firm*—Eyre, Mann & Lucas

[57] ABSTRACT

A pulse-energized, DC-biased oscillator/amplifier which responds to the coupling of an external impedance comprising either a substantial capacitive or resistive component to the tank circuit of the oscillator by attenuating the oscillations developed therein in response to each energizing pulse. The amplifier is pulse-energized contemporaneously with the oscillator, and its output is detected to develop a voltage for controlling a utilization circuit.

12 Claims, 1 Drawing Figure

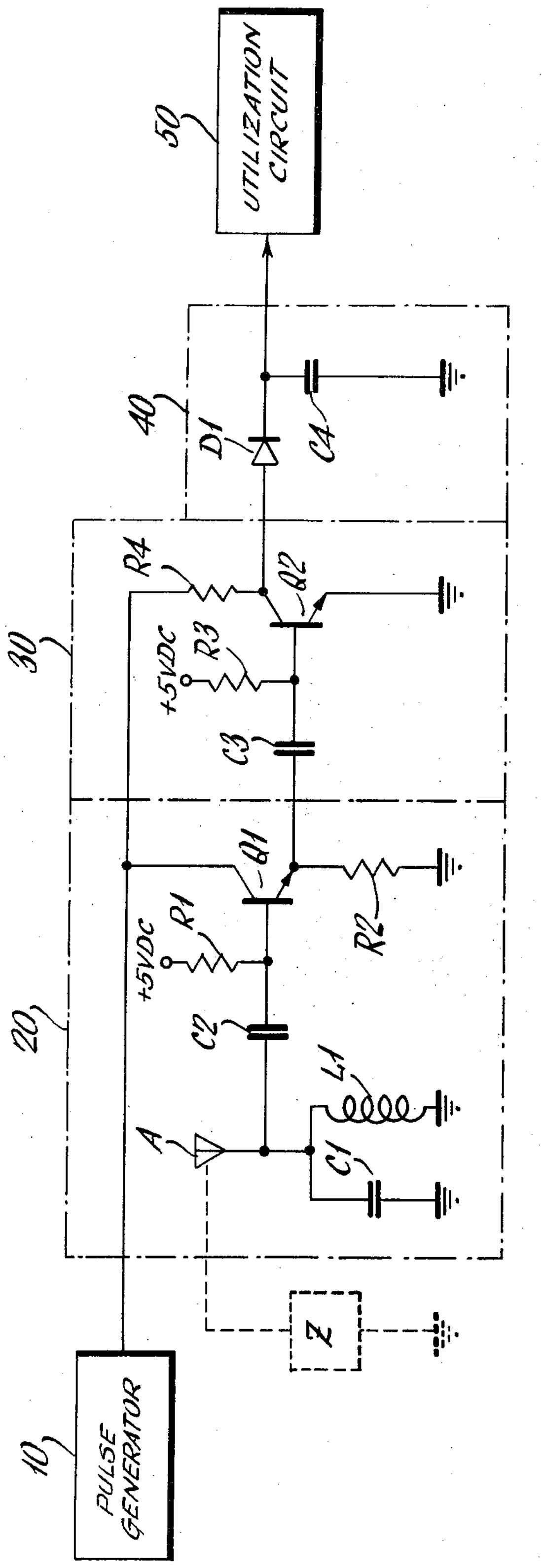
50
UTILIZATION CIRCUIT
40
D1
C4
30
R4
Q2
+5VDC
R3
C3
20
+5VDC
R1
Q1
C2
R2
L1
A
C1
Z
10
PULSE GENERATOR

CONDITION-RESPONSIVE CONTROL CIRCUIT INCLUDING PULSE-ENERGIZED OSCILLATOR AND AMPLIFIER

CROSS-REFERENCE TO RELATED APPLICATIONS

The present invention represents a significant technological advance over the CAPACITANCE- AND RESISTANCE-RESPONSIVE CONTROL CIRCUITS disclosed and claimed in copending U.S. Pat. application Ser. No. 280,219 filed on Aug. 14, 1972 in the name of Carl E. Atkins. The present invention may advantageously incorporate a pulse generator of the type disclosed and claimed in copending U.S. Pat. application Ser. No. 255,155 entitled ELECTRONIC TIMING CIRCUITS filed on May 19, 1972 in the name of Paul A. Carlson.

BACKGROUND OF THE INVENTION

The present invention relates to condition-responsive control circuitry. A wide variety of such circuits may be found in the prior art for detecting changes in a variety of conditions which may be detected as changes in values of certain electrical parameters such as capacitance or resistance; see, for example, the following U.S. patents:

| Patent No. | Inventor |
|---|---|
| 3,200,304 | Atkins et al. |
| 3,200,305 | Atkins |
| 3,275,897 | Atkins |
| Re 26,828 | Atkins et al. |
| 3,314,081 | Atkins et al. |
| 3,339,212 | Atkins et al. |
| 3,382,408 | Atkins |
| 3,435,298 | Atkins et al. |
| 3,492,542 | Atkins |
| 3,551,753 | Atkins |
| 3,555,368 | Atkins |
| 3,564,346 | Atkins |
| 3,568,005 | Atkins |
| 3,568,006 | Atkins |
| 3,569,728 | Atkins |
| 3,723,967 | Atkins et al. |

However, in certain applications such as detecting seat occupancy in automobiles, it is necessary to minimize power dissipation to prevent battery drain. Furthermore, it is desirable to achieve a high degree of discrimination with a relatively simple circuit having a minimum number of components. The present invention is directed toward the accomplishment of all of these objects.

SUMMARY OF THE INVENTION

The present invention is embodied in and carried out by a condition-responsive control circuit in which an oscillator tank circuit is intermittently energized by a pulse generator through one junction of the oscillator transistor, thereby causing the oscillator to produce an oscillatory output during the application of each pulse. The change in the amplitude and/or duration of this oscillatory output caused by the coupling of an external impedance having a substantial capacitive or resistive component to the oscillator tank circuit is fed to an amplifier which is intermittently energized contemporaneously with the oscillator, and the amplified output is detected to provide a control signal for application to a utilization circuit.

BRIEF DESCRIPTION OF THE DRAWING

The present invention may be better understood by reading the written description thereof with reference to the accompanying drawing which is a circuit diagram showing a preferred embodiment of the present invention.

DESCRIPTION OF THE PREFERRED EMBODIMENT

Referring now to the drawing, a pulse generator of a suitable type such as is disclosed in the cross-referenced applications provides pulses of positive polarity between which the output voltage of the pulse generator is substantially null, i.e., at approximately ground potential. These pulses are fed to oscillator 20 and amplifier 30 to energize these circuits intermittently. Oscillator 20 comprises a tank circuit formed by parallel-connected capacitance C1 and inductance L1, with an antenna A being connected in parallel with these tank circuit components to enable coupling of an external impedance Z thereacross. The point of connection of antenna A, capacitance C1 and inductance L1 is connected through capacitance C2 to the base of oscillator transistor Q1, which is provided with a bias voltage of +5 volts DC through resistance R1 to its base. The collector of Q1 is connected directly to the output of pulse generator 10, and the emitter is connected through resistance R2 to ground. The output of oscillator 20 is derived across the emitter-follower resistance R2, and is fed through blocking capacitance C3 to the base of amplifier transistor Q2. A bias voltage of +5 volts DC is applied through resistance R3 to the base of Q2, the collector of which is connected through resistance R4 to the output of pulse generator 10, with the emitter being connected directly to ground. The output of amplifier 30 is derived at the collector of transistor Q2, and is fed to detector 40 comprising diode D1 and capacitance C4. The control voltage developed across capacitance C4 is applied to a utilization circuit 50.

In a typical operation cycle, a positive rectangular pulse is simultaneously applied directly to the collector of transistor Q1 and through resistance R4 to the collector of transistor Q2. Because the two transistors are DC-biased, when their collectors are at ground potential between pulses, the bias current flows through the collector-base junction because it has a lower forward drop than does the emitter-base junction. When the positive pulse suddenly appears at the collector of each transistor, the collector-base junction is abruptly back-biased. However, due to the continuing presence of charge carriers at this junction for a brief period of time after the initiation of the energizing pulse, there is a brief flow of current across the collector-base junction of Q1 into the tank circuit, thereby initiating oscillation. When there is no external impedance Z coupled to the tank circuit of oscillator 20, the output at the emitter of transistor Q1 comprises a direct current component and an oscillatory component during each period of energization. Forward bias on the base of transistor Q1 builds up gradually as the blocking capacitance C2 is charged through the relatively high resistance R1, thereby resulting in removing switching transients which would otherwise be present and make detection difficult.

The radio frequency component of the output appearing at the emitter of Q1 is fed to amplifier 30 through blocking capacitance C3. When the positive energizing pulse from pulse generator 10 is applied through resistance R4 to the collector of Q2 contemporaneously with its application to the collector of Q1, the collector-base junction of Q2 is suddenly back-biased. As previously described in connection with transistor Q1 of oscillator 20, charge carriers remain present at this junction for a brief period of time after initiation of the energizing pulse. Consequently, back bias on the base of transistor Q2 builds up gradually as the blocking capacitance C3 must be charged through the high series resistance R3, thereby removing switching transients which would otherwise occur and make detection difficult. The output derived at the collector of transistor Q2 is applied through diode D1 to capacitance C4, which form detector 40. Thus, a positive output voltage will be developed across capacitance C4 as the normal output of the control circuit, i.e., the output which will be produced when the oscillations in the tank circuit of oscillator 20 are unattenuated by the coupling of an external impedance Z to antenna A. If an external impedance Z having either a substantial capacitive or resistive component is ohmically or capacitively coupled to the tank circuit C1, inductance L1 through antenna A, the oscillations therein will be sharply attenuated, thereby causing a decrease in the oscillator output which in turn results in a decrease of the output of amplifier 30. This will be detected by detector circuit 40 to result in a decreased control voltage applied to utilization circuit 50, which may be chosen to respond thereto in a predetermined manner.

The shock-excited condition-responsive control circuit described above may be operated with a steady DC voltage instead of pulse inputs. However, this pulsing or shock-exciting technique has a number of advantages. First, greater circuit sensitivity is achieved, since weak oscillatory feedback can be used to enhance sensitivity with the assurance that the shock-excitation by the next pulse will always restart the oscillation once the external impedance Z is decoupled from antenna A. In addition, multiplexing of several control circuits by a single pulse generator is possible. Third, the duty cycle in an individual control circuit is such that demands on the supply of battery-stored power are significantly reduced.

In the preferred embodiment of the present invention shown in the drawing, the values of the various components are as follows:

| Resistances | Capacitances |
|---|---|
| R1 – 220K ohms | C1 – 75 picofarads |
| R2 – 1K ohm | C2 – 50 picofarads |
| R3 – 220K ohms | C3 – 50 picofarads |
| R4 – 10K ohms | C4 – .1 microfarad |
| Inductance | Semiconductor Devices |
| L1 – 47 microhenries | Q1 – 2N5132 |
| | Q2 – 2N5132 |
| | D1 – 1N4148 |

The advantages of the present invention, as well as certain changes and modifications of the disclosed embodiment thereof, will be readily apparent to those skilled in the art. For example, the discrete capacitance C1 may be eliminated by arranging the values of the components of oscillator 20 so that the normal capacitance formed by antenna A is sufficient to enable oscillation. Amplifier means energized in the conventional manner may be coupled to the output of amplifier 30 to further amplify same before detection and/or utilization. Alternatively, such conventional amplifier means may be employed in lieu of pulse-energized amplifier 30. It is the applicant's intention to cover all these changes and modifications which could be made to the embodiment of the invention herein chosen for the purposes of the disclosure without departing from the spirit and scope of the invention.

What is claimed is:

1. A condition-responsive control circuit comprising:

1. first means operative to generate energizing pulses; and
2. second means operative to receive said energizing pulses and normally to produce oscillations during each pulse period, said second means being further operative to sense the coupling thereto of an external impedance having a substantial capacitive or resistive component and to attenuate said oscillations in response thereto.

2. The control circuit according to claim 1 further comprising amplifier means operative to receive said energizing pulses and to amplify said oscillations during each pulse period.

3. The control circuit according to claim 2 further comprising detection means operative to convert the output of said amplifier means to a control signal.

4. The control circuit according to claim 1 wherein said second means is operative to generate an oscillatory output voltage combined with a direct-current output voltage during each pulse period in the absence of said coupling of an external impedance having a substantial capacitive or resistive component to said second means.

5. The control circuit according to claim 1 wherein said second means comprises an oscillator circuit comprising:

1. a direct-current-biased transistor having its collector coupled to said first means to receive said energizing pulses;
2. a tank circuit including an antenna enabling said coupling of an external impedance thereto; and
3. a blocking capacitance connecting said tank circuit to the base of said transistor.

6. The control circuit according to claim 5 wherein said oscillator comprises a resistance connected between a source of direct-current voltage and said transistor base to provide said direct-current bias to said transistor.

7. The control circuit according to claim 5 wherein said tank circuit comprises an inductance and the capacitance formed by said antenna.

8. The control circuit according to claim 5 wherein said tank circuit comprises an inductance and a capacitance connected in parallel, said antenna being connected to the high junction thereof.

9. The control circuit according to claim 2 wherein said amplifier means comprises:

1. a direct-current-biased transistor;
2. a resistance connecting the collector of said transistor to said first means to receive said energizing pulses; and 3. a blocking capacitance connected between the output of said first means and the base of said amplifier transistor.

10. The control circuit according to claim 9 wherein said amplifier means comprises a resistance connected between a source of direct-current voltage and said transistor base to provide said direct-current bias to said transistor.

11. The control circuit according to claim 3 wherein said detection means comprises a diode connected from the output of said amplifier means to an output capacitance across which said control signal is developed.

12. A condition-responsive control circuit comprising:

1. a pulse generator circuit;
2. an oscillator circuit including a tank circuit and operative to be intermittently energized by the output of said pulse generator means and normally operative during each period of intermittent energization to produce an oscillatory output, and further operative when an external impedance comprising a substantial capacitive or resistive component is coupled to said tank circuit to produce a sharply attenuated oscillatory output;
3. an amplifier circuit intermittently energized by said pulse generator circuit contemporaneously with the intermittent energization of said oscillator means and operative to receive and amplify the output of said oscillator means; and
4. a detection circuit operative to convert the output of said amplifier means to a control signal.

* * * * *